United States Patent [19]

Masuyuki et al.

[11] Patent Number: 5,473,435
[45] Date of Patent: Dec. 5, 1995

[54] METHOD OF MEASURING THE BENT SHAPE OF A MOVABLE MIRROR OF AN EXPOSURE APPARATUS

[75] Inventors: Takashi Masuyuki; Kenji Nishi; Shinichi Takagi, all of Kawasaki, Japan

[73] Assignee: Nikon Corporation, Tokyo, Japan

[21] Appl. No.: 338,170

[22] Filed: Nov. 9, 1994

Related U.S. Application Data

[63] Continuation of Ser. No. 84,131, Jul. 1, 1993, abandoned.

[30] Foreign Application Priority Data

Jul. 7, 1992 [JP] Japan .................................. 4-203073
Sep. 4, 1992 [JP] Japan .................................. 4-236938

[51] Int. Cl.$^6$ .................................................. G01B 11/00
[52] U.S. Cl. .......................... 356/372; 356/358; 356/363; 356/401; 355/53; 355/77
[58] Field of Search ..................... 356/357, 358, 356/363, 372, 375, 373, 399–401; 355/53, 77

[56] References Cited

U.S. PATENT DOCUMENTS

| | | | |
|---|---|---|---|
| 4,677,301 | 6/1987 | Tanimoto et al. | 250/548 |
| 4,871,237 | 10/1989 | Anzai et al. | 359/666 |
| 5,117,255 | 5/1992 | Shiraishi et al. | 355/53 |
| 5,151,749 | 9/1992 | Tanimoto et al. | 356/375 |

FOREIGN PATENT DOCUMENTS

| | | | |
|---|---|---|---|
| 170602 | 8/1986 | Japan | 356/358 |

*Primary Examiner*—F. L. Evans
*Attorney, Agent, or Firm*—Shapiro and Shapiro

[57] ABSTRACT

A method of measuring a bent shape of a movable mirror of an exposure apparatus, which includes:
a two-dimensionally movable stage;
a movable mirror provided to the stage;
a position measurement device for radiating a light beam onto the movable mirror, and measuring a position of the stage using the light beam reflected by the movable mirror;
an illumination optical system for illuminating a mask; and
a projection optical system for forming an image on the mask on a photosensitive substrate placed on the stage, includes:
the first step of stepping the stage along array coordinates on the basis of a measured value of the position measurement device;
the second/step of sequentially exposing first and second measurement marks on the photosensitive substrate, so that images of at least two first measurement marks and images of at least two second measurement marks substantially overlap each other, the mask having the first and second measurement marks;
the third step of measuring differences between positions of the images of the first and second measurement marks; and
the fourth step of calculating a bent shape of the movable mirror on the basis of the differences between the positions of the images of the first and second measurement marks.

20 Claims, 11 Drawing Sheets

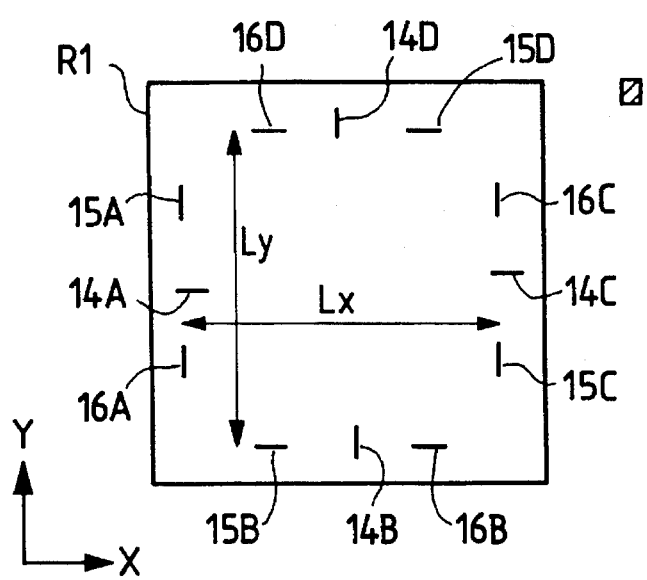
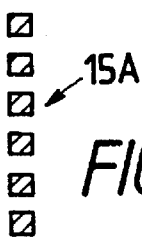
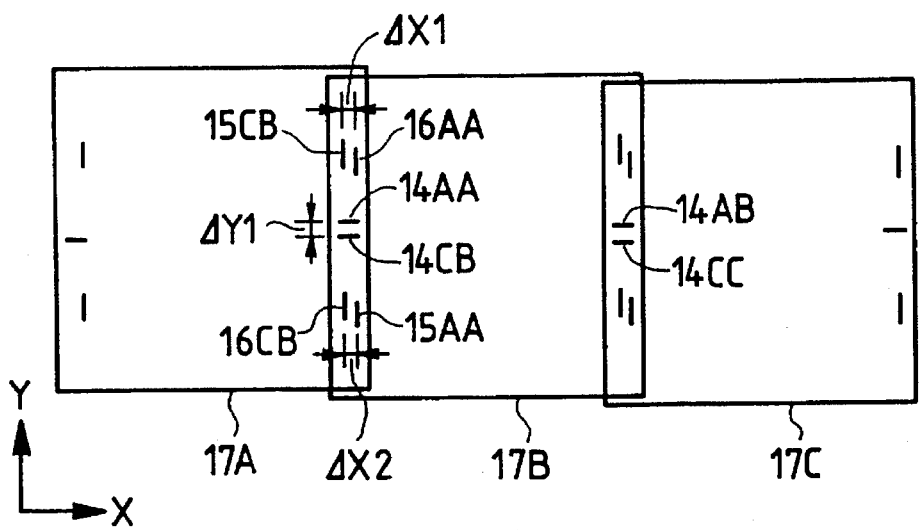

METHOD OF MEASURING THE BENT SHAPE OF A MOVABLE MIRROR OF AN EXPOSURE APPARATUS

This is a continuation of application Ser. No. 08/084,131 filed Jul. 1, 1993, now abandoned.

BACKGROUND OF THE INVENTION

1. Field of the Invention

The present invention relates to a measurement method and an exposure method using the same and, more particularly, to a measurement method suitably used in, for example, a case wherein the bent shape of a movable mirror for measuring the coordinates of a wafer stage of an exposure apparatus is measured or the distortion of a projection optical system of the exposure apparatus is measured, and an exposure method suitably used in, for example, a projection exposure apparatus, which performs exposure on shot areas of a wafer on a wafer stage while positioning the wafer stage by measuring the coordinates of the wafer stage fixed with a movable mirror by a laser interference wavelength measurement method.

2. Related Background Art

When a semiconductor element or a liquid crystal display element is manufactured using a photolithography technique, a step-and-repeat type reduction projection exposure apparatus (stepper) for projecting a reticle pattern onto a wafer coated with a photosensitive material and placed on a wafer stage via a projection optical system is used. In this projection exposure apparatus, the coordinates of the wafer stage are measured by a laser interferometer so as to precisely set the positioning coordinates of a wafer.

FIG. 12 shows a schematic arrangement of a conventional projection exposure apparatus. Referring to FIG. 12, exposure light IL emitted from a light source 1 such as a mercury lamp is focused by an elliptic mirror 2, is collimated into a substantially parallel light beam by an input lens 3, and is then incident on a fly-eye lens 4. A large number of secondary light sources are formed on a rear-side focal plane of the fly-eye lens 4, and the exposure light IL emerging from these secondary light sources is properly focused by a condenser lens system 5 to illuminate a reticle R. Although not shown, the condenser lens system 5 comprises a variable field stop, and the illumination field on the reticle R can be arbitrarily set by the variable field stop. Under the exposure light IL, a pattern on the reticle R is projected in a reduced scale onto each shot area S on the wafer W via a projection optical system PL.

The wafer W is held on a wafer stage 6, and the wafer stage 6 is constituted by an XY stage for positioning the wafer W in a plane perpendicular to the optical axis of the projection optical system PL, a Z stage for positioning the wafer W in the optical axis direction of the projection optical system PL, a θ table for finely rotating the wafer W, and the like. If the orthogonal coordinate system on a plane perpendicular to the optical axis of the projection optical system PL is defined as X- and Y-axes, a movable mirror 7X for the X-axis, which has a reflection surface perpendicular to the X-axis in design, and a movable mirror 7Y for the Y-axis, which has a reflection surface perpendicular to the Y-axis in design, are fixed on the wafer stage 6.

When a laser beam LB1 from a laser interferometer 8X for the X-axis is reflected by the movable mirror 7X, and a laser beam LB2 from a laser interferometer 8Y for the Y-axis is reflected by the movable mirror 7Y, the laser interferometers 8X and 8Y measure the X- and Y-coordinates of the wafer stage 6. When the wafer stage 6 is driven according to an instruction from a controller (not shown), the coordinates (X, Y) of the wafer W on the wafer stage 6 can be set to be arbitrary coordinates.

An imaging characteristic controller 9 controls the imaging characteristics such as a magnification error and the like of the projection optical system PL by adjusting the pressure in a predetermined lens chamber of the projection optical system PL, as disclosed in, e.g., U.S. Pat. No. 4,871,237. In addition to the control of the pressure in the lens chamber, the controller 9 can adjust a state of, e.g., a distortion of the projection optical system by adjusting the interval between lenses in the projection optical system PL, or by adjusting the inclination angle of the reticle R, as disclosed in, e.g., U.S. Pat. No. 5,117,255.

In general, a semiconductor element is manufactured by transferring a large number of layers of circuit patterns to overlap each other on a wafer. In this case, for example, a circuit pattern of the second layer must be overlaid on a circuit pattern of the first layer with high precision. In particular, when the circuit patterns of the first and second layers are respectively exposed by different exposure apparatuses, overlay precision (matching precision) between the different exposure apparatus must be satisfactorily maintained. As one factor which largely influences the overlay precision, the distortion of the projection optical system PL is known. In the conventional system, the distortion of the projection optical system PL is measured as follows.

First, a reticle R formed with measurement marks shown in FIG. 13A is prepared. Referring to FIG. 13A, measurement marks for the X- and Y-directions are formed on each of 16 mark areas 10-1 to 10-16 on the reticle R. A pattern on the reticle R is full-field exposed on the wafer W (FIG. 12). In this case, measurement mark images 11X for the X-direction and measurement mark images 11Y for the Y-direction are projected on an area on the wafer W corresponding to, e.g., the mark area 10-10 in FIG. 13A, as shown in FIG. 13B. The measurement mark images 11X include grating patterns aligned at a predetermined pitch in the Y-direction, and the measurement mark images 11Y include grating patterns aligned at a predetermined pitch in the X-direction. Similarly, the measurement mark images for the X- and Y-directions are projected in correspondence with other mark areas 10-i (i≠10).

The illumination field is focused to, e.g., the mark area 10-3 alone in FIG. 13A while sequentially stepping the wafer W by a predetermined amount, and the measurement mark images on the mark area 10-3 are overlay-exposed on the images on each of the full-field exposed mark areas 10-j (j≠3). In this case, in order to overlay-expose the images on the mark area 10-3 on the images on, e.g., the mark area 10-10, if the distance, in the Y-direction on the reticle R, between the mark areas 10-3 and 10-10 is represented by L, and the projection magnification of the projection optical system PL is represented by β, the wafer W is stepped by βL in the Y-direction, and the images on the mark area 10-3 are overlay-exposed.

As a result, as shown in FIG. 13B, measurement mark images 12X and 12Y for the X- and Y-directions on the mark area 10-3 are projected near the measurement mark images 11X and 11Y on the mark area 10-10. When the overlay-exposed wafer W is, e.g., developed, a large number of projected measurement mark images are fixed on the wafer W as recess or projecting patterns. Thereafter, a slit-like measurement beam is radiated onto the wafer W from a pattern measurement device attached to the projection exposure apparatus (FIG. 12) or an independent measurement device, thereby scanning the wafer W and the measurement beam relative to each other.

For example, as for the measurement mark images shown in FIG. 13B, a measurement beam 13X for the X-direction extending in the Y-direction in a slit pattern is projected onto the wafer W. In this state, when the measurement beam 13X is scanned relative to the wafer W in the X-direction, strong diffracted light emerges in a predetermined direction when the measurement beam 13X crosses the measurement mark images 12X or the measurement mark images 11X. Thus, a relative coordinate when the measurement beam 13X coincides with the center of the measurement mark images 12X or 11X can be detected. Therefore, a position shift ΔX in the X-direction between the measurement mark images 12X and 11X can be detected. Note that a method of measuring the position of the mark from the central position (a position where the measurement beam coincides with the center of the mark) of the intensity distribution of diffracted light obtained by relatively moving the measurement beam and the wafer (measurement mark on the wafer) is disclosed in, e.g., U.S. Pat. No. 4,677,301.

Similarly, when a measurement beam for the Y direction extending in the X-direction in a slit pattern (not shown) is scanned relative to the wafer W in the Y-direction, a position shift ΔY in the Y-direction between the measurement mark images 12Y and 11Y can be detected. These position shifts ΔX and ΔY respectively correspond to the distortions of the projection optical system PL. When the position shifts in the X- and Y-directions of the measurement mark images are detected for other mark areas 10-i (i≠10), the distortion on the entire exposure area of the projection optical system PL can be measured.

As described above, in the conventional projection exposure apparatus shown in FIG. 12, the coordinates of the wafer stage 6 are measured by reflecting the movable mirrors 7X and 7Y on the wafer stage 6. However, as shown in, e.g., FIG. 14, when the reflection surface of the movable mirror 7X has poor flatness, an array of shot areas S(1,1), S(1,2), S(1,3), . . . formed in the Y-direction on the wafer W are shifted from an ideal grating array in the X-direction. Similarly, when the reflection surface of the movable mirror 7Y has poor flatness, an array of shot areas S(1,1), S(2,1), S(3,1), . . . formed in the X-direction on the wafer W are shifted in the Y-direction. In another projection exposure apparatus, it is assumed that the movable mirrors 7X and 7Y have different bent shapes, and arrays of shot areas formed on the wafer W are shifted in a different way.

Therefore, after a pattern of the first layer is exposed on the wafer W using a certain projection exposure apparatus, when a pattern of the second layer is exposed on the wafer W using another projection exposure apparatus, since the arrays of shot areas are shifted in a different way, matching precision is impaired, and the defective rate of semiconductor elements formed on the wafer W is undesirably increased.

As disclosed in U.S. Pat. No. 5,151,749, a method of obtaining a bent amount of a reflection mirror on the basis of a difference between measurement values of two-dimensional, i.e., X and Y θ interferometers is also known. However, this method is easily influenced by feed precision (stepping error) of a stage.

In the conventional method of measuring the distortion described above with reference to FIGS. 13A and 13B, the measurement precision of the overlapping portion between the measurement mark images 12X and 11X in, e.g., FIG. 13B is satisfactory. However, when positioning precision of stepping upon overlay-exposure of only the mark area 10-3 (FIG. 13A) while stepping the wafer W is poor, the measurement result of the position shift ΔX between the measurement mark images 12X and 11X includes a stepping error, and the measurement precision of the distortion is impaired. When the measurement results of distortions in different exposure apparatuses include different errors, matching precision between the different exposure apparatuses is also impaired.

SUMMARY OF THE INVENTION

It is an object of the present invention to improve matching precision between different exposure apparatuses in consideration of the above situation. More specifically, it is an object of the present invention to provide a measurement method for precisely measuring a bent shape of a movable mirror of an exposure apparatus so as to improve matching precision by correcting an error caused by the bent shape of the movable mirror of the exposure apparatus, which comprises a stage, fixed with the movable mirror, for positioning a photosensitive substrate in a two-dimensional plane, and coordinate measurement means for measuring the coordinates of the stage using a light beam reflected by the movable mirror.

Furthermore, it is another object of the present invention to provide a measurement method capable of precisely measuring a distortion of a projection optical system of an exposure apparatus without being influenced by a stepping error so as to improve matching precision by correcting the distortion of the projection optical system.

It is still another object of the present invention to perform exposure by correcting an error caused by a bent shape of a movable mirror of an exposure apparatus, which comprises a stage, fixed with the movable mirror, for positioning a photosensitive substrate in a two-dimensional plane, and coordinate measurement means for measuring the coordinates of the stage using a light beam reflected by the movable mirror, so as to improve matching precision between different exposure apparatuses.

According to the present invention, as shown in, e.g., FIGS. 1A to 3, a first method for measuring a bent shape of a movable mirror of an exposure apparatus, which comprises a stage, fixed with the movable mirror, for positioning a photosensitive substrate in a two-dimensional plane, coordinate measurement means for measuring the coordinates of the stage using a light beam reflected by the movable mirror, an illumination optical system for illuminating a mask with exposure light, and a projection optical system for projecting an image on the mask onto a photosensitive substrate, comprises the step of sequentially exposing, using, as the mask, a measurement mask on which a plurality of first measurement marks are formed near one end of a pattern area, and a second measurement marks are formed near the other end of the pattern area, a pattern on the measurement mask on the photosensitive substrate on the stage while stepping the stage on the basis of the coordinates measured using the movable mirror, so that images of the first and second measurement marks substantially overlap each other.

Furthermore, according to the present invention, the method comprises the step of measuring a rotation amount of an image of the measurement mask transferred onto the photosensitive substrate on the basis of a difference between the positions of the images of the first and second measurement marks exposed on the photosensitive substrate, and the step of calculating a relative array of a plurality of shot areas on the photosensitive substrate on the basis of the difference between the positions of the images of the first and second measurement marks exposed on the photosensitive substrate, and the rotation amount of the image on the measurement mask. With this method, the bent shape of the movable mirror is calculated on the basis of the calculated relative array of the plurality of shot areas.

Also, according to the present invention, as shown in, e.g., FIGS. 1B, 4, and 5, a second measurement method for measuring a distortion of a projection optical system of an exposure apparatus, which comprises a stage for positioning a photosensitive substrate in a two-dimensional plane, coordinate measurement means for measuring the coordinates of the stage, an illumination optical system for illuminating a mask with exposure light, and a projection optical system for projecting an image on the mask onto a photosensitive substrate, comprises the first step of exposing, using, as the mask, a measurement mask on which first measurement marks, second measurement marks arranged near the first measurement marks, and third measurement marks arranged at positions corresponding to distortion measurement points are formed, all patterns on the measurement mask on the photosensitive substrate on the stage.

Furthermore, according to the present invention, the method comprises the second step of exposing the first and second measurement marks on the measurement mask near the third measurement marks by stepping the stage, and the third step of measuring a stepping error of the stage on the basis of a difference between the positions of the images of the second measurement marks exposed in the first step, and the positions of the images of the second measurement marks exposed in the second step. With this method, the distortion of the projection optical system is calculated on the basis of a difference between the positions of the images of the third measurement marks exposed on the photosensitive substrate in the first step and the positions of the images of the first measurement marks exposed in the second step, the stepping amount of the stage in the second step, and the stepping error measured in the third step.

According to the first measurement method of the present invention, when the positions of the images of the first and second measurement marks present on an overlapping portion between adjacent shot areas are measured, the offset and the rotation amount of stepping between the adjacent shot areas can be obtained. When the offset and the rotation amount are corrected, a relative position shift between the adjacent shot areas caused by only the bent shape of the movable mirror can be calculated.

Upon repetition of this operation, offset errors and rotation amount errors of stepping between each two adjacent shot areas are sequentially calculated toward the outer periphery of the photosensitive substrate with reference to shot areas near the center of the photosensitive substrate, and the total sum of these errors is calculated, thereby obtaining a relative position shift amount of a series of shot areas. Therefore, an error caused upon stepping of the stage can be precisely corrected, and the bent shape of the movable mirror can be calculated with high precision on the basis of a shift amount of an actual array from the ideal array of shot areas.

According to the second measurement of the present invention, when the second measurement marks are exposed to substantially overlap the previously exposed second measurement marks, only an error upon stepping of the stage, which error does not include any distortion of the projection optical system, can be calculated. Therefore, when the difference between the positions of the images of the first and third measurement marks is corrected based on the error caused by stepping, an error caused by only the distortion of the projection optical system can be calculated with high precision.

When exposure is performed using the measurement results according to the first and second measurement methods, matching precision between different exposure apparatuses can be improved.

According to the present invention, an exposure method for an exposure apparatus, which comprises a stage, fixed with the movable mirror, for positioning a photosensitive substrate in a two-dimensional plane, coordinate measurement means for measuring the coordinates of the stage using a light beam reflected by the movable mirror, an illumination optical system for illuminating a mask with exposure light, and a projection optical system for projecting an image on the mask onto a photosensitive substrate, comprises the step of sequentially exposing, using, as the mask, a measurement mask on which a plurality of first measurement marks are formed near one end of a pattern area, and a second measurement marks are formed near the other end of the pattern area, a pattern on the measurement mask on the photosensitive substrate on the stage while stepping the stage on the basis of the coordinates measured using the movable mirror, so that images of the first and second measurement marks substantially overlap each other.

Furthermore, according to the present invention, the method comprises the step of calculating a relative array of a plurality of shot areas on the photosensitive substrate on the basis of a difference between the positions of the images of the first and second measurement marks exposed on the photosensitive substrate, the step of calculating a bent shape of the movable mirror on the basis of the calculated relative array of the plurality of shot areas, and the step of exposing, using, as the mask, an exposure mask formed with a transfer pattern, the pattern on the exposure mask on each shot area of the photosensitive substrate on the stage while stepping the stage on the basis of the coordinates obtained by correcting the coordinates measured using the movable mirror by the calculated bent shape of the movable mirror.

In this case, it is preferable that the step of measuring a rotation amount of the image on the measurement mask transferred onto the plurality of shot areas on the photosensitive substrate on the basis of the difference between the positions of the images of the first and second measurement marks exposed on the photosensitive substrate is executed between the step of calculating the relative array of the plurality of shot areas and the step of calculating the bent shape of the movable mirror, so that the relative array of the plurality of shot areas on the photosensitive substrate is calculated on the basis of the difference between the positions of the images of the first and second measurement marks and the rotation amount of the images on the measurement mask.

According to the present invention, the shape of the movable mirror on the stage is measured using a concept called an absolute array method. The method of measuring the shape of the movable mirror according to the absolute array method will be described below.

Assume that the movable mirror is bent, as shown in FIG. 8A. In this case, when exposure is linearly performed on the photosensitive substrate along an axis (to be referred to as an "X-axis" hereinafter) parallel to the movable mirror in design, the positions, in the Y-axis direction perpendicular to the X-axis, of a series of shot areas are bent along the movable mirror. In order to calculate this bent shape, as shown in FIG. 8B, a shift amount Δy between the central position of a shot area neighboring the first shot area, and the central position of a prospective moving position indicated by a broken line is measured, and such shift amounts are added in turn from a certain reference shot area. When the sum shift amount is plotted along the X-axis, the bent shape of the movable mirror can be calculated.

Then, when exposure is linearly performed along the X-axis on the photosensitive substrate while correcting an error of the measured coordinates of the stage caused by the bent shape of the movable mirror, a series of shot areas obtained by this exposure can be free from a shift in the Y-axis direction. Therefore, matching precision among different exposure apparatuses can be improved.

According to the present invention, since the bent shape of the movable mirror is measured, and the exposure position is corrected based on the measured value, exposed patterns can be arrayed straight, and matching precision when overlay exposure is performed on patterns exposed by a certain exposure apparatus using another exposure apparatus can be improved. Even when the flatness precision upon working of the movable mirror is lowered, the exposure positions can be arrayed straight by correcting the bent shape of the movable mirror. Therefore, the movable mirror can have low working precision. As a result, even when a large movable mirror is used, the movable mirror can be easily worked, and manufacturing cost can be lowered.

When the rotation amount of the images on the measurement mask is corrected, only the bent shape of the movable mirror can be precisely measured regardless of the inclination of the measurement mask or rotation of the stage upon stepping.

BRIEF DESCRIPTION OF THE DRAWINGS

FIG. 2A is a plan view showing a pattern on a test reticle R1 of the first embodiment, FIG. 2B is an enlarged plan view of measurement marks 14A, and FIG. 2C is an enlarged plan view of measurement marks 15A;

FIG. 3 is a plan view showing main part on a wafer in an exposure state upon measurement of the bent shape of the movable mirror according to the first embodiment;

DESCRIPTION OF THE PREFERRED EMBODIMENTS

The first embodiment of the present invention will be described below with reference to the accompanying drawings. In this embodiment, the present invention is applied to a case wherein the bent shapes of the movable mirrors 7X and 7Y are measured in the projection exposure apparatus shown in FIG. 12, and to a case wherein the distortion of the projection optical system PL is measured in the apparatus shown in FIG. 12.

[Embodiment of Method of Measuring Bent Shape of Movable Mirror]

A method of measuring the bent shapes of the movable mirrors 7X and 7Y shown in FIG. 12 will be described below. In this case, a test reticle R1 shown in FIG. 2A is used. As shown in FIG. 2A, a measurement mark 14A for the Y-direction is formed at the central portion near the left side of a pattern area on the test reticle R1, and measurement marks 15A and 16A for the X-direction are formed above and below the mark 14A. The measurement mark 14A includes grating patterns arrayed at a predetermined pitch in the X-direction, as shown in FIG. 2B, and each of the measurement marks 15A and 16A includes grating patterns arrayed at a predetermined pitch in the Y-direction, as shown in FIG. 2C. The method of detecting the positions of the images of these measurement marks has already been described above with reference to FIG. 13B. Note that the measurement marks 14A, 15A, and 16A may include slit-like patterns or cross-shaped patterns.

Similarly, near the right side of the pattern area on the test reticle R1, measurement marks 15C and 16C for the X-direction are formed to sandwich a central measurement mark 14C for the Y-direction. Near the lower side of the pattern area, measurement marks 15B and 16B for the Y-direction are formed to sandwich a central measurement mark 14B for the X-direction. Near the upper side of the pattern area, measurement marks 15D and 16D for the Y-direction are formed to sandwich a central measurement mark 14D for the X-direction. An operation executed when the bent shapes of the movable mirrors 7X and 7Y in FIG. 12 are measured using this test reticle R1 will be described below with reference to the flow chart of FIG. 1A, and FIG. 3.

Figure 1A:
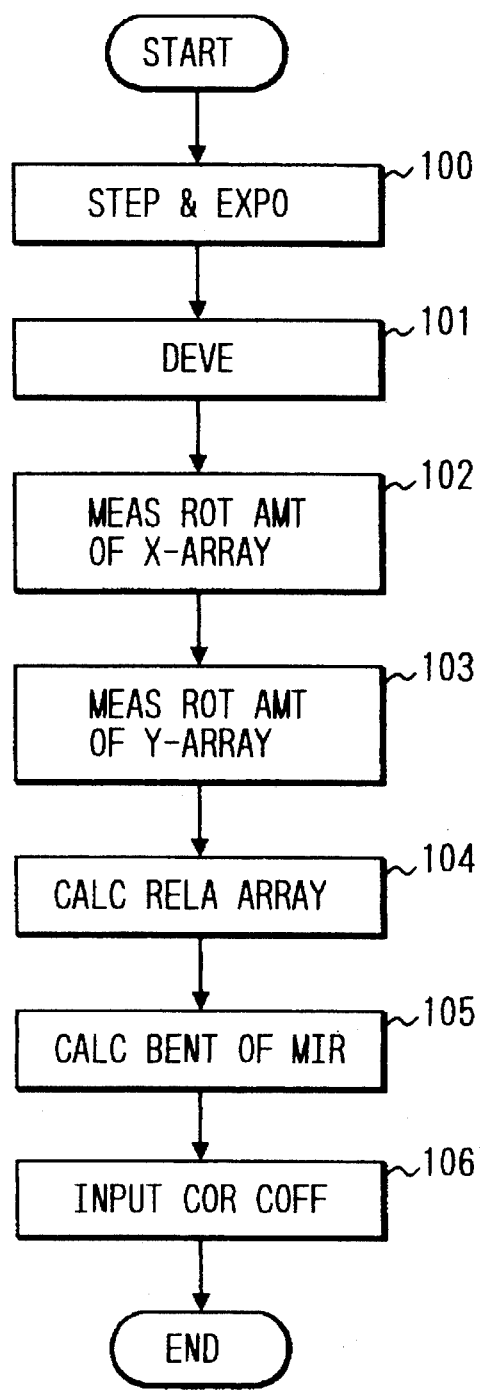
FIG. 1A is a flow chart showing a method of measuring the bent shape of a movable mirror according to the first embodiment of the present invention.
Figure 12:
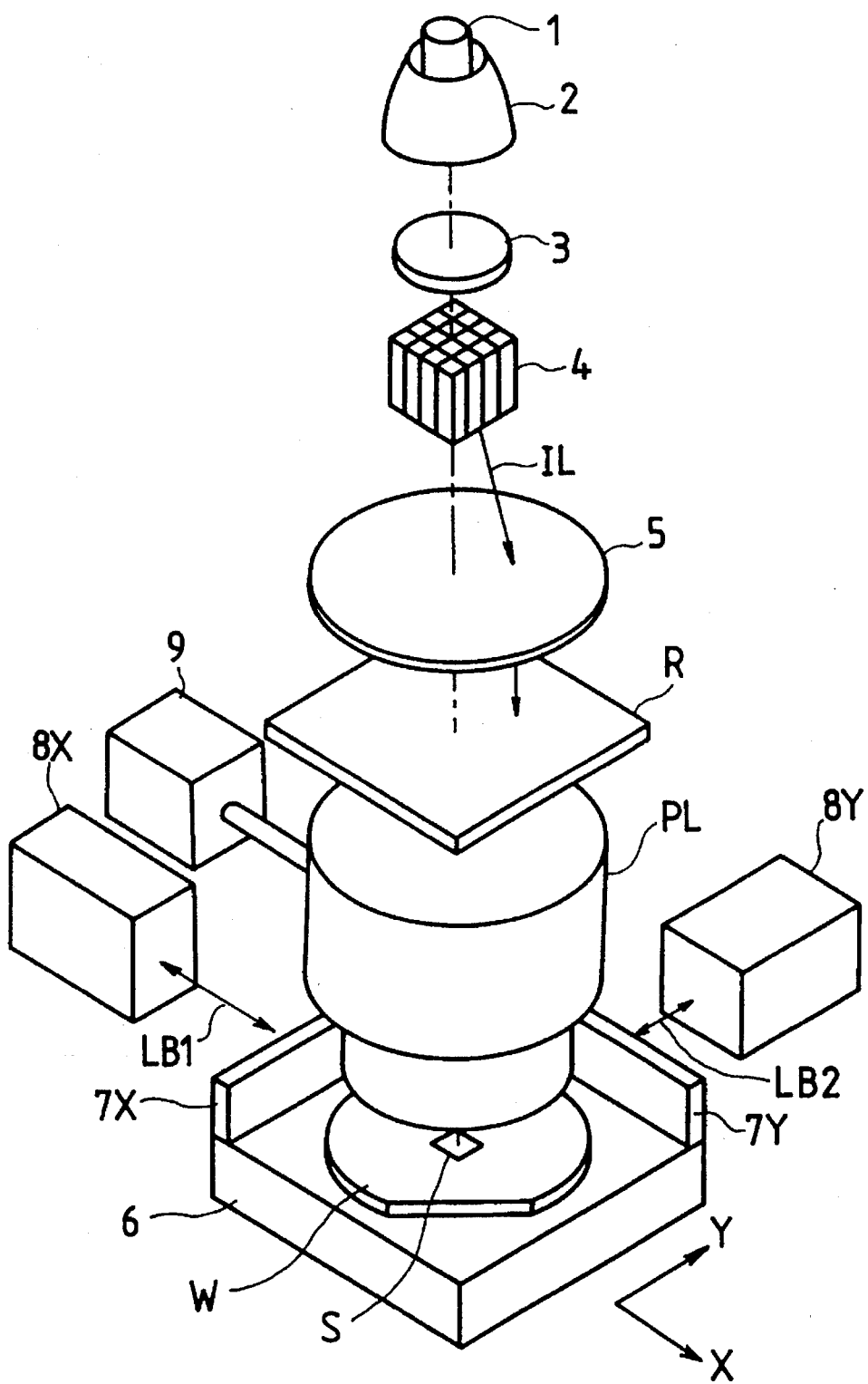
FIG. 12 is a perspective view showing a schematic arrangement of a conventional projection exposure apparatus.
Figure 13A:
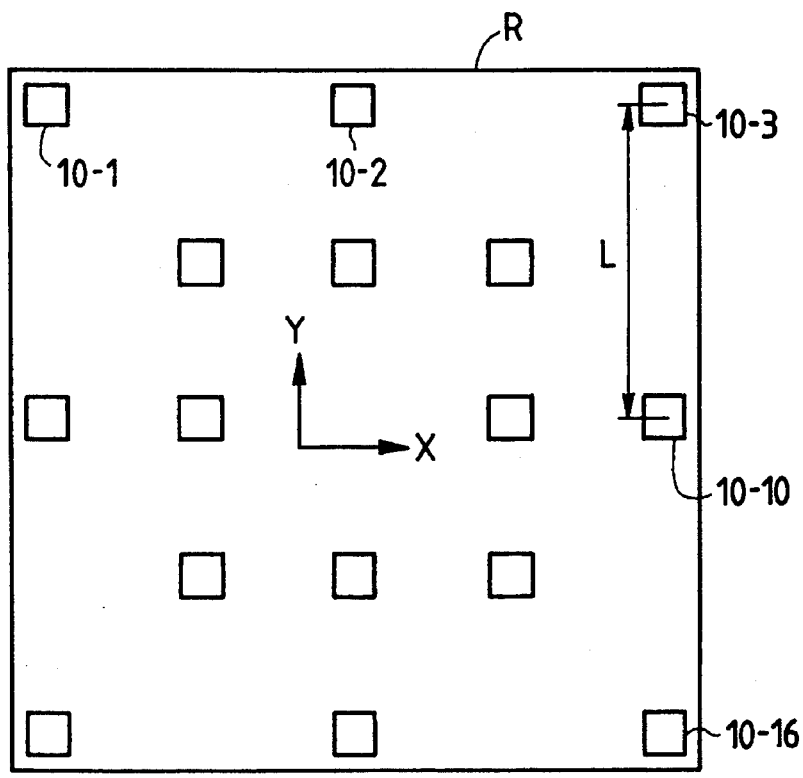
FIG. 13A is a plan view showing a pattern on a conventional test reticle R.
Figure 13B:
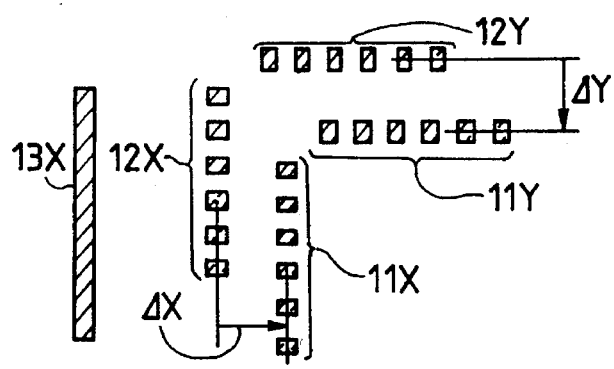
FIG. 13B is an explanatory view of a conventional method of detecting the positions of measurement mark images.
Figure 14:
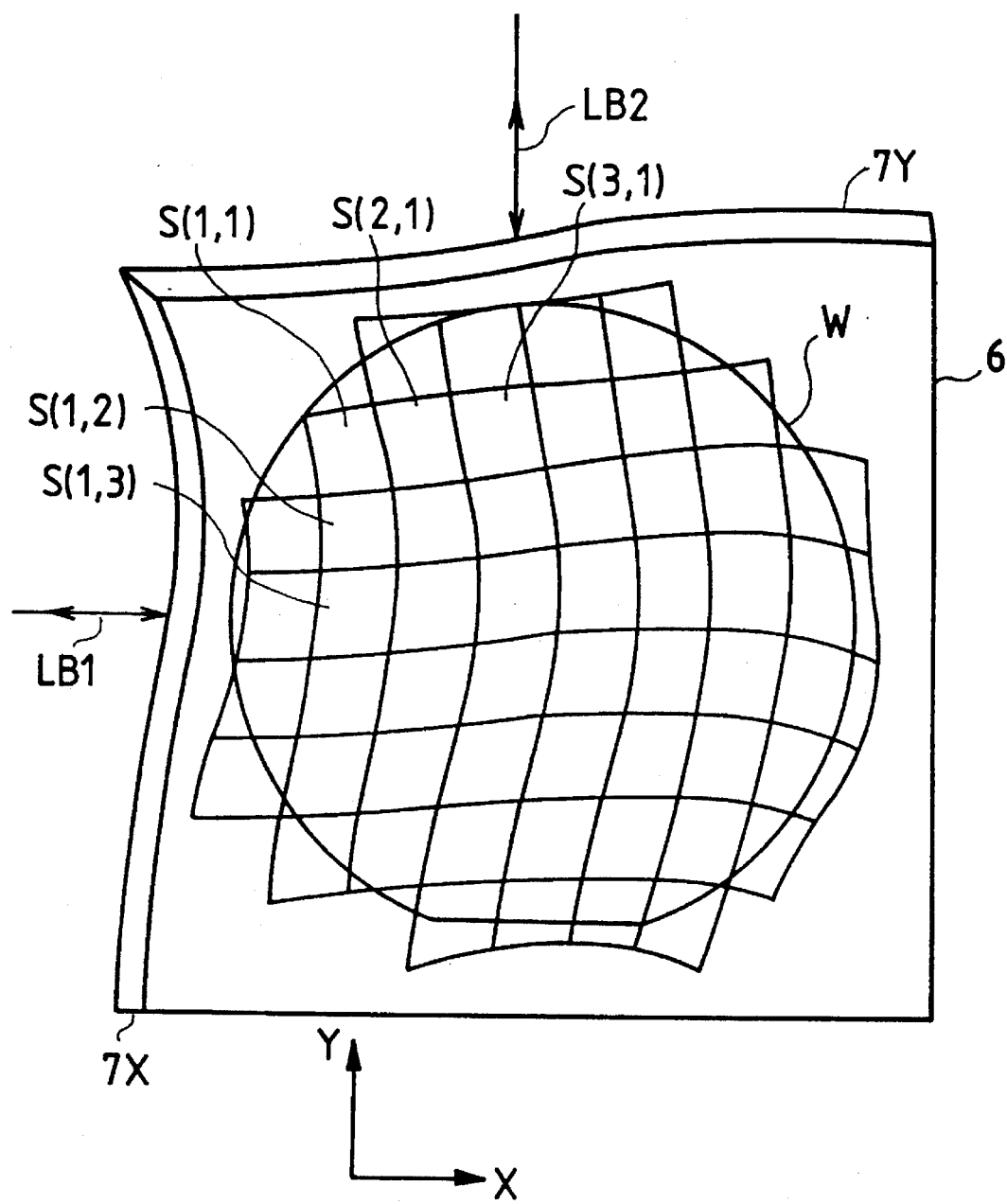
FIG. 14 is a plan view showing a bent state of an array of shot areas due to the bent shape of a movable mirror.

In step 100 in FIG. 1A, the pattern on the entire surface of the test reticle R1 (FIG. 2A) is sequentially exposed on arrays of shot areas in the X- and Y-directions on the wafer W coated with a photosensitive material such as a resist, while stepping the wafer stage 6 (FIG. 12). In this case, as shown in FIG. 3, the pattern is exposed on an array of shot areas 17A, 17B, 17C, . . . in the X-direction, so that the measurement mark images on the end portions in the X-direction overlap each other. Although not shown, the pattern is exposed on an array of shot areas in the Y-direction, so that the measurement mark images on the end portions in the Y-direction overlap each other.

Then, the wafer W is subjected to, e.g., development to convert latent images exposed in step 100 into recess or projecting patterns (step 101). Thereafter, the rotation amount errors and offset errors upon stepping of an array of shot areas in the X-direction are sequentially measured (step 102), and the rotation amount errors and offset errors upon stepping of an array of shot areas in the Y-direction are also sequentially measured (step 103). A method of measuring the rotation amount and offset of stepping between adjacent shot areas in the X-direction will be described in detail below with reference to FIG. 3.

Referring to FIG. 3, images 14AA to 16AA of the measurement marks 14A to 16A (FIG. 2A) are formed on the right end portion of the first shot area 17A in the X-direction, and images 14CB to 16CB of the measurement marks 14C to 16C (FIG. 2A) are formed on the left end portion of the next shot area 17B. Of these images, an interval $\Delta X1$ in the X-direction between the measurement mark images 15CB and 16AA, an interval $\Delta X2$ in the X-direction between the measurement mark images 16CB and 15AA, and an interval $\Delta Y1$ in the Y-direction between the measurement mark images 14AA and 14CB are measured by the method utilizing diffracted light from the marks, which method has been described above with reference to FIG. 13B.

In this case, when neither rotation nor offset occur in a transition process from the shot area 17A to the shot area 17B, the following equation is established using a predetermined interval $\Delta X0$:

$$\Delta X1 = \Delta X2 = \Delta X0 \quad (1)$$

Therefore, the difference between the intervals $\Delta X1$ and $\Delta X2$ corresponds to a rotation amount $\Delta R1$ upon stepping, and the difference between the average value of these intervals and the interval $\Delta X0$ corresponds to an offset $\Delta O1$. Thus, the following equations are established:

$$\Delta R1 = \Delta X1 - \Delta X2 \quad (2)$$

$$\Delta O1 = (\Delta X1 + \Delta X2)/2 - \Delta X0 \quad (3)$$

Similarly, the rotation amount and offset of stepping between the shot areas 17B and 17C can be calculated.

In step 104, a relative array among an array of shot areas is calculated while executing the rotation amount correction. More specifically, in the case of FIG. 3, the approximate value of the shift amount in the Y-direction between the shot areas 17A and 17B is the difference between a shift amount $\Delta Y1$ in the Y-direction between the measurement mark images 14AA and 14CB, and a predetermined reference amount $\Delta Y0$. A value obtained by correcting this difference to compensate for the rotation amount $\Delta R1$ given by equation (2) corresponds to a shift amount $\Delta P1$ of the array in the Y-direction, and the following equation is established using a predetermined coefficient k:

$$\Delta P1 = \Delta Y1 - \Delta Y0 - k \cdot \Delta R1 \quad (4)$$

Similarly, a shift amount $\Delta P2$ of the array in the Y-direction between the shot areas 17B and 17C is calculated by correcting the shift amount in the Y-direction between the measurement mark images 14AB and 14CC to compensate for the rotation amount. Also, a shift amount of the array in the X-direction between shot areas arrayed in the Y-direction is calculated by correcting a shift amount in the X-direction between the images of the measurement marks 14D and 14B (FIG. 2A) to compensate for the rotation amount. Thus, the shift amounts of arrays of shot areas in the X- and Y-directions from ideal grating arrays can be calculated.

Thereafter, in step 105, the bent amounts of the movable mirrors 7X and 7Y are calculated. The bent amounts of the movable mirrors 7X and 7Y can be calculated by sequentially accumulating the relative arrays between adjacent shot areas calculated in step 104. The bent amounts of the movable mirrors 7X and 7Y are input as correction coefficients to the projection exposure apparatus (step 108), and the projection exposure apparatus performs offset correction for the measured values of the laser interferometers 8X and 8Y (FIG. 12). Thus, in the projection exposure apparatus (FIG. 12), the arrays of shot areas on the wafer W become almost equal to ideal grating arrays, and matching precision between different exposure apparatuses can be improved.

[Embodiment of Method of Measuring Distortion of Projection Optical System]

Figure 4A:
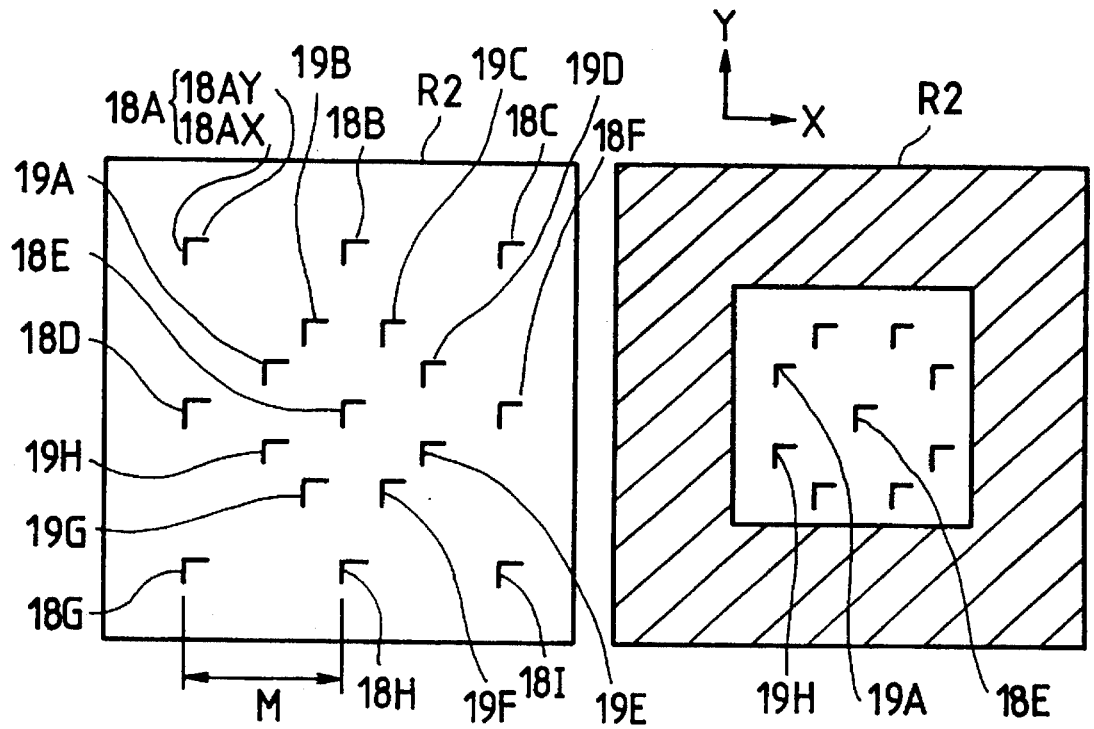
FIG. 4A is a plan view showing a pattern on a test reticle R2 of the first embodiment.

A method of measuring the distortion of the projection optical system PL (FIG. 12) will be described below. In this case, a test reticle R2 shown in FIG. 4A is used. As shown in FIG. 4A, main measurement marks 18A, 18B, . . . , 18I are formed at grating points of grating arrays on a pattern area of the test reticle R2. For example, the main measurement mark 18A includes a measurement mark 18AX for the X-direction, and a measurement mark 18AY for the Y-direction, and each of the measurement marks 18AX and 18AY includes grating patterns, as shown in FIG. 2C or 2B. Other main measurement marks 18B, . . . , 18I similarly include measurement marks for the X- and Y-directions.

Eight sub measurement marks 19A to 19H are formed around the main measurement mark 18E at the center of the test reticle R2. These sub measurement marks 19A to 19H also include measurement marks for the X- and Y-directions. The sub measurement marks 19A and 19H are located on the central line between the main measurement marks 18D and 18E, and the sub measurement marks 19D and 19E are located on the central line between the main measurement marks 18F and 18E. Other sub measurement marks 19B, 19C, 19F, and 19G are respectively located on the corresponding central lines. A method of detecting the images of these main and sub measurement marks is the method for detecting diffracted light from these marks, as has already been described above with reference to FIG. 13B. An operation executed when the distortion of the projection optical system PL (FIG. 12) is measured using this test reticle R2 will be described below with reference to the flow chart 6f FIG. 1B and FIGS. 5A and 5B.

Figure 1B:
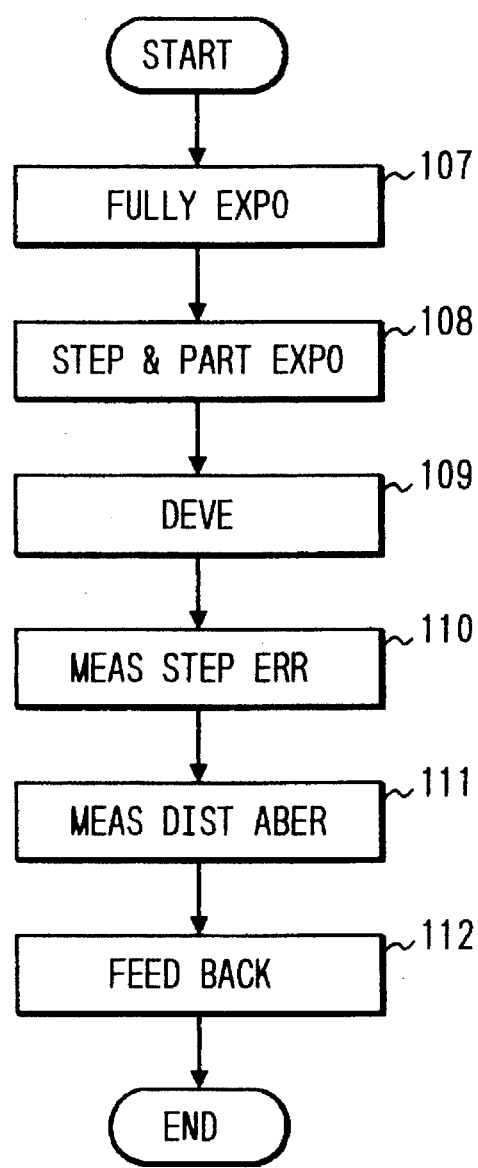
FIG. 1B is a flow chart showing a method of measuring a distortion of a projection optical system of the first embodiment.
Figure 4B:
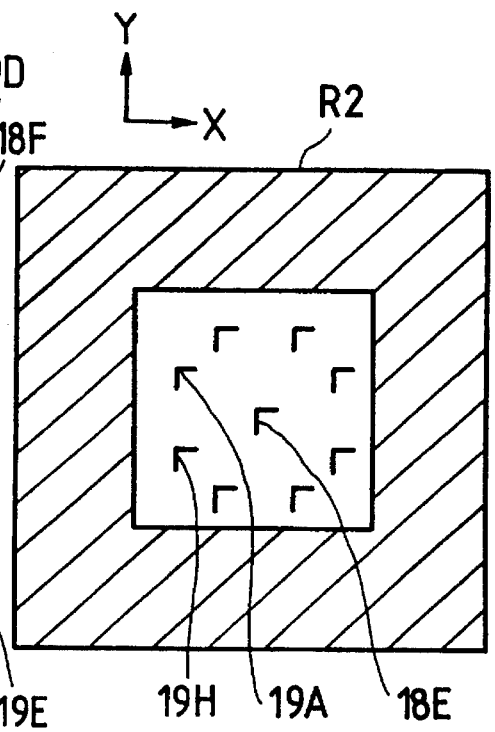
FIG. 4B is a plan view showing a case wherein the test reticle R2 is partially shielded.
Figure 5A:
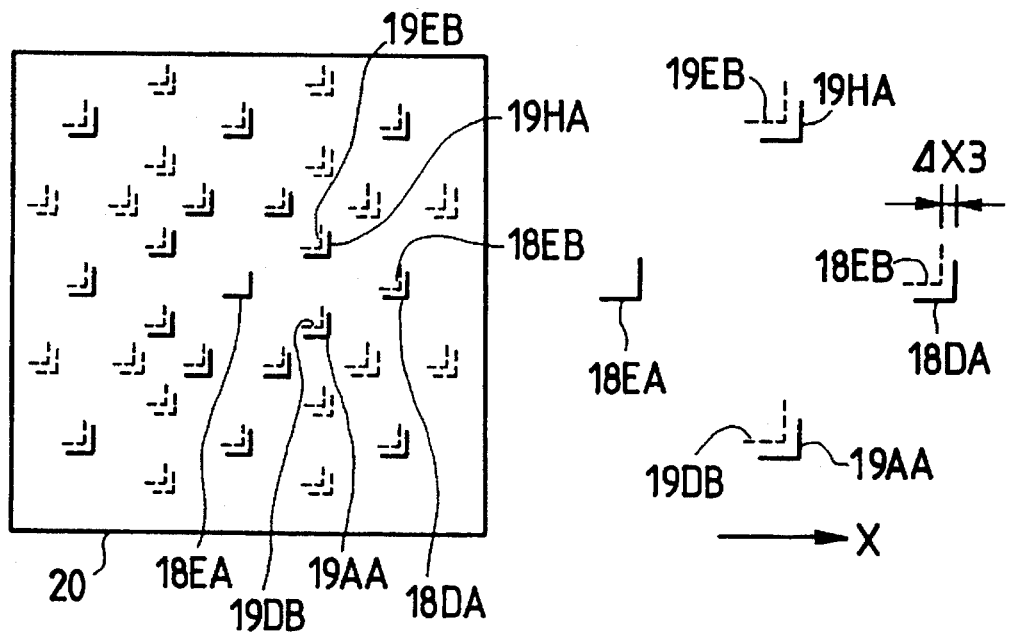
FIG. 5A is a plan view of a shot area on a wafer in an exposure state upon measurement of the distortion of the projection optical system in the first embodiment.

In step 107 in FIG. 1B, the pattern on the entire surface of the test reticle R2 is exposed on the wafer W coated with a photosensitive material such as a resist (FIG. 12). Thus, images indicated by solid lines on a shot area 20 in FIG. 5A are exposed. In step 108, as shown in FIG. 4B, the illumination field of exposure light is limited to only the central main measurement mark 18E and the sub measurement marks 19A to 19H around the mark 18E of the measurement marks on the test reticle R2. In this state, partial exposure is sequentially performed while stepping the wafer stage 6 (FIG. 12), so that the image of the main measurement mark 18E overlaps on each of the images of the main measurement marks 18A to 18D and 18F to 18I exposed on the wafer W in step 107. Thus, images indicated by dotted lines in FIG. 5A are exposed.

Then, the wafer W is subjected to, e.g., development to convert latent images exposed in steps 107 and 108 into recess or projecting patterns (step 109). Thereafter, moving errors upon stepping are sequentially measured (step 110). A method of measuring a moving error of stepping on an area where the image of the main measurement mark 18D (FIG. 4A) overlaps the image of the main measurement mark 18E will be described in detail below with reference to FIGS. 5A and 5B.

On the shot area 20 in FIG. 5A, an image 18EB of the main measurement mark 18E is formed near an image 18DA of the main measurement mark 18D. Assume that the interval in the X-direction between the main measurement marks 18E and 18D on the test reticle R2 (FIG. 4A) is represented by M, and the projection magnification of the projection optical system is represented by $\beta$. When the main measurement mark image 18EB is exposed by stepping the wafer W by $\beta M$ in the X-direction, if neither the distortion of the projection optical system nor the moving error upon stepping occur, the main measurement mark images 18DA and 18EB coincide with each other. In practice, the positions of these images are shifted in the X- and Y-directions due to the distortion of the projection optical system and the moving error upon stepping.

Figure 5B:
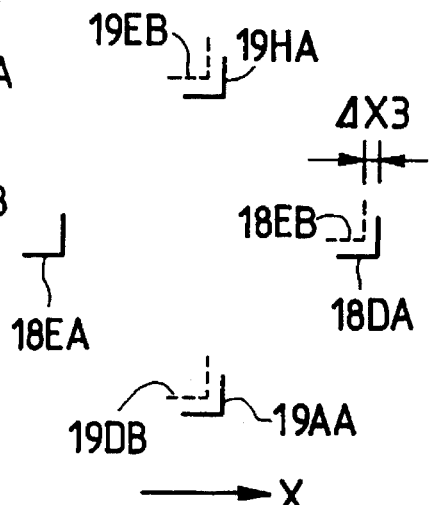
FIG. 5B is an enlarged plan view of main part of FIG. 5A.

An image 19HA of the sub measurement mark 19H and an image 19AA of the sub measurement mark 19A exposed in step 107, and an image 19EB of the sub measurement mark 19E and an image 19DB of the sub measurement mark 19D exposed in step 108 are formed to almost overlap each other at an intermediate position between an image 1SEA of the main measurement mark 18E exposed in step 107 and an image 18DA of the main measurement mark 18D exposed in step 108. FIG. 5B is an enlarged view of these mark images. Referring to FIG. 5B, since the sub measurement mark images 19HA and 19EB are projected at substantially the same positions, a position shift between these images is free from the influence of the distortion of the projection optical system.

Therefore, a difference between a reference amount and the position shift amount between the sub measurement mark images 19HA and 19EB is caused by the moving error upon stepping. Similarly, a difference between the reference amount and the position shift amount between the sub measurement mark images 19DB and 19AA is caused by the moving error upon stepping. Thus, stepping errors can be obtained. Similarly, the moving errors upon stepping can be obtained from the shift amounts of the sub measurement mark images on an area where another main measurement mark image overlaps the image of the main measurement mark 18E.

In step 111, the distortion of the projection optical system is measured while correcting the moving error upon stepping. More specifically, in, e.g., FIG. 5B, if a position shift amount in the X-direction between the main measurement mark images 18EB and 18DA is represented by $\Delta X3$, a result obtained by correcting the shift amount $\Delta X3$ to compensate for the moving error upon stepping is a distortion, in the X-direction, of the projection optical system PL shown in FIG. 12. Similarly, a distortion in the Y-direction is measured. Distortions, in the X- and Y-directions, of the projection optical system PL are calculated in correspondence with the positions of other main measurement marks 18A, 18B, . . . . Thereafter, in step 112, the distortion of the projection optical system PL is fed back to the projection exposure apparatus. More specifically, the characteristics of the distortion of the projection optical system PL are set in a predetermined state via the imaging characteristic controller 9 using the projection exposure apparatus shown in FIG. 12. Thus, matching precision between different exposure apparatuses can be improved.

The second embodiment of the present invention will be described below with reference to FIGS. 2A to 2C and FIGS. 6 to 11. In this embodiment, the present invention is applied to an exposure method of a projection exposure apparatus for performing exposure by a step-and-repeat method. The same reference numerals in FIG. 7 denote the same parts as in FIG. 12, and a detailed description thereof will be omitted.

Figure 7:
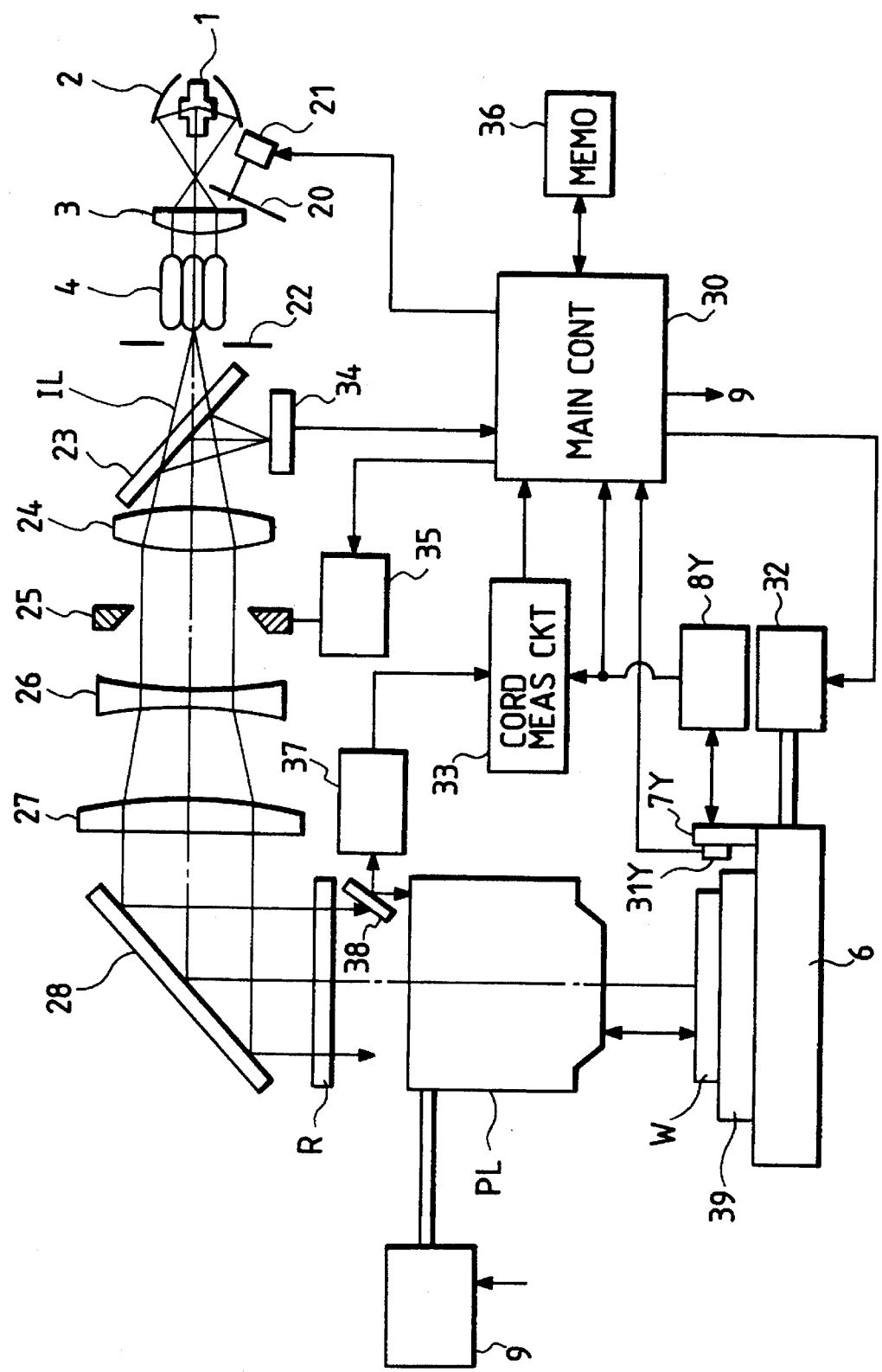
FIG. 7 is a schematic diagram and a partial sectional view of an arrangement of a projection exposure apparatus to which the second embodiment of the present invention is applied.

FIG. 7 shows a schematic arrangement of a projection exposure apparatus of this embodiment. Referring to FIG. 7, exposure light IL emitted from a light source 1 is focused by an elliptic mirror 2, is collimated into a substantially parallel light beam by an input lens 3, and is then incident on a fly-eye lens 4. A shutter 20 is arranged near the second focal point of the elliptic mirror 2 and is driven by a drive motor 21 to control supply and stop of exposure light to the input lens 3. The exposure light IL emerging from the input lens 3 illuminates a reticle R with a uniform illuminance via an aperture stop 22, a beam splitter 23, a first relay lens 24, a variable field stop (variable reticle blind) 25, a second relay lens 26, a condenser lens 27, and a mirror 28. The aperture stop 22 is almost conjugate with the pupil plane (Fourier transform plane) of a projection optical system PL, and the variable field stop 25 is almost conjugate with the pattern formation surface of the reticle R. An illumination area on the reticle R can be arbitrarily set by the variable field stop 25.

Under the exposure light IL, an image of the pattern on the reticle R is projected on each shot area on a wafer W via the projection optical system PL. The wafer W is placed on a wafer stage 6 via a wafer holder 29. A movable mirror 7Y for the Y-axis is fixed to one end on the wafer stage 6, and a movable mirror 7X (see FIG. 12) for the X-axis is fixed to the other end on the wafer stage 6, although not shown. In this embodiment, a temperature sensor 31Y is attached to the rear surface of the movable mirror 7Y, and a temperature sensor 31X (not shown) is also attached to the rear surface of the movable mirror 7X for the X-axis.

A main control system 30 controls the operations of the overall apparatus, and receives temperature information of the movable mirrors 7Y and 7X measured by the temperature sensors 31Y and 31X. A laser beam emitted from a laser interferometer 8Y for the Y-axis is reflected by the movable mirror 7Y, and the coordinate information of the wafer stage 6 measured by the laser interferometer 8Y and a laser interferometer 8X (not shown; see FIG. 12) for the X-axis is supplied to the main control system 30 and a coordinate measurement circuit 33 (to be described later). The main control system 30 positions the wafer stage 6 via a driver 32. The main control system 30 provides information for controlling the imaging characteristics of the projection optical system PL to an imaging characteristic controller 9. As described above, the imaging characteristic controller 9 controls the imaging characteristics of the projection optical system PL by adjusting the pressure in a predetermined lens chamber in the projection optical system PL or by adjusting the interval between lenses in the projection optical system PL.

Referring to FIG. 7, the exposure light reflected by the wafer W returns to the beam splitter 23 via the projection optical system PL, the reticle R, and the like. The exposure light reflected again by the beam splitter 23 is incident on the light-receiving surface of a reflection amount monitor 34 comprising a photoelectric conversion element arranged at a position conjugate with the pupil plane of the projection optical system PL. A detection signal from the reflection amount monitor 34 is supplied to the main control system 30, and the main control system 30 calculates the reflectance of the wafer W on the basis of the detection signal. The main control system 30 sets the shape of the aperture portion of the variable field stop 25 to be a predetermined shape via a driver 35, and stores various kinds of information in a memory 36.

Alignment light emitted from an off-axis alignment system 37 is reflected by a mirror 38, and the reflected light is incident on the projection optical system PL. The alignment light emerging from the projection optical system PL is incident on the wafer W. The alignment light reflected by scattering or diffraction by the marks on the wafer W returns to the alignment system 37 via the projection optical system PL and the mirror 38. A detection signal output from an internal photoelectric conversion element of the alignment system 37 is supplied to the coordinate measurement circuit 33. When the wafer stage 6 is driven to move the wafer W in a plane perpendicular to the optical axis of the projection optical system PL, if the alignment light crosses the marks on the wafer W, strong reflected light of the alignment light returns to the alignment system 37, thereby detecting the positions of the marks on the wafer W. More specifically, two-dimensional coordinate information of each mark on the wafer W is supplied from the coordinate measurement system 33 to the main control system 30, and the main Control system 30 stores the information in the memory 36.

The exposure operation of this embodiment will be described below with reference to the flow chart shown in FIG. 6. First, the bent amounts of the movable mirror 7Y for the Y-axis (FIG. 7) and the movable mirror 7X for the X-axis (see FIG. 12) are measured. For this purpose, the test reticle R1 shown in FIG. 2A is used. As described above, the measurement mark 14A for the Y-direction is formed at the central portion near the left side of the pattern area on the test reticle R1, and the measurement marks 15A and 16A for the X-direction are formed above and below the mark 14A. The measurement mark 14A includes grating patterns arrayed at a predetermined pitch in the X-direction, as shown in FIG. 2B, and the measurement mark 15A (or 16A) includes grating patterns arrayed at a predetermined pitch in the Y-direction, as shown in FIG. 2C.

For example, the position of an image of the measurement mark 14A on the wafer W can be detected by scanning the image in the Y-direction with a slit-like laser beam elongated +in the X-direction. Also, the position of an image of the measurement mark 15A on the wafer W can be detected by scanning the image in the X-direction with a slit-like laser beam elongated in the Y-direction. Note that the measurement marks 14A, 15A, and 16A may include slit-like patterns or cross-shaped patterns. In the case of the cross-shaped patterns, both the positions, in the X- and Y-directions, of the measurement marks 14A, 15A, and 16A can be measured, and the information amount of position measurement is doubled.

Similarly, the measurement marks 15C and 16C for the X-direction are formed near the right side of the pattern area on the test reticle R1 to sandwich the central measurement mark 14C therebetween. Also, measurement marks 15B and 16B for the Y-direction are formed near the lower side of the pattern area to sandwich the central measurement mark 14B for the X-direction, and measurement marks 15D and 16D for the Y-direction are formed near the upper side of the pattern area to sandwich the central measurement mark 14D for the X-direction. The measurement marks 14C, 15C, 16C, 14B, 15B, 16B, 14D, 15D, and 16D may include slit-like patterns or cross-shaped patterns as in the measurement marks 14A, 15A, and 16A. Assume that the interval in the X-direction between the measurement marks 15A (or 16A) and 16C (or 15C) is represented by Lx, and the interval in the Y-direction between the measurement marks 15B (or 16B) and 16D (or 15D) is represented by Ly. In this embodiment, Lx=Ly. The bent amounts of the movable mirrors 7Y (FIG. 7) and 7X (FIG. 12) are measured using this test reticle R1.

Figure 6:
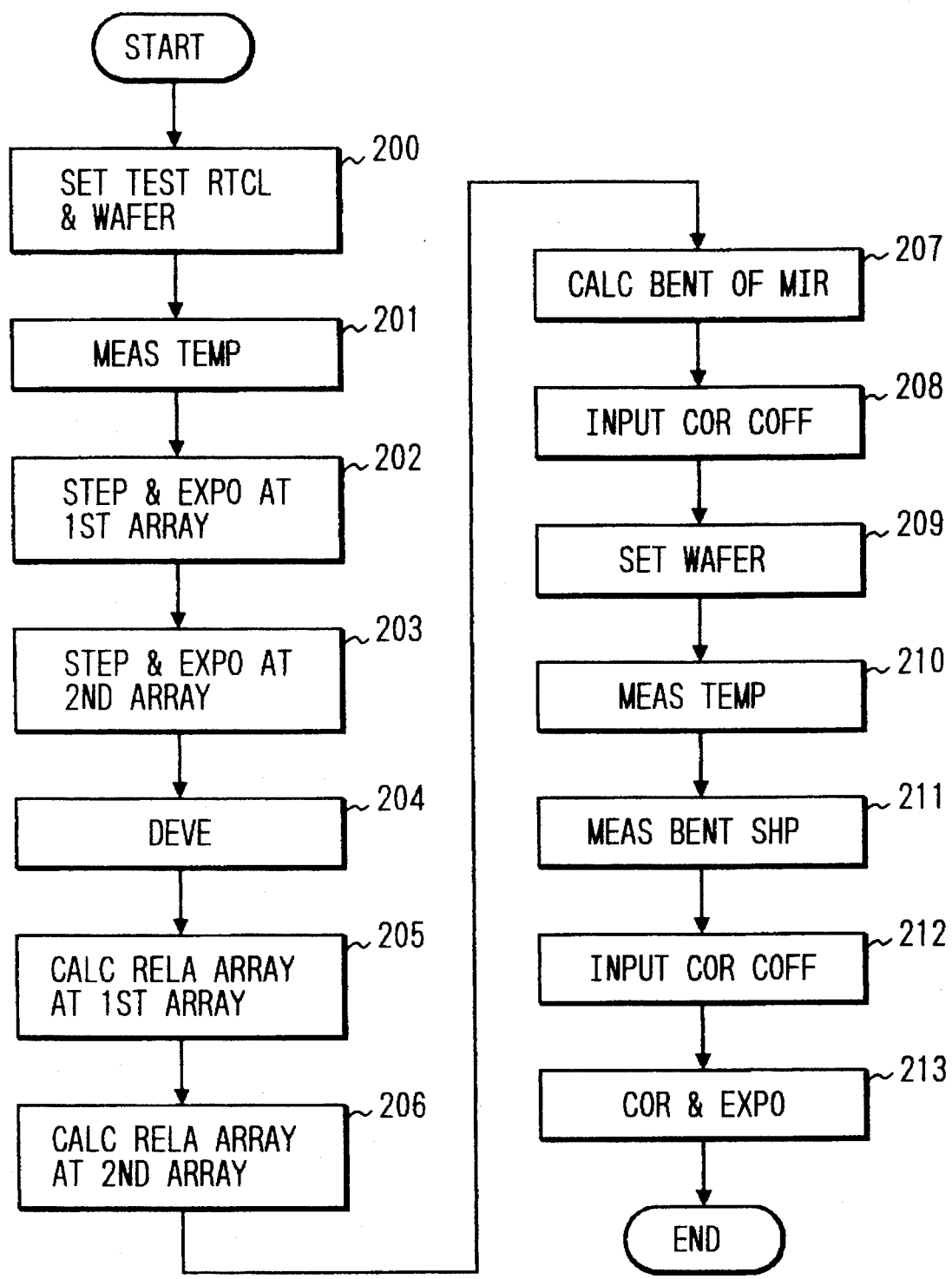
FIG. 6 is a flow chart showing an exposure operation according to the second embodiment of the present invention.
Figure 8A:
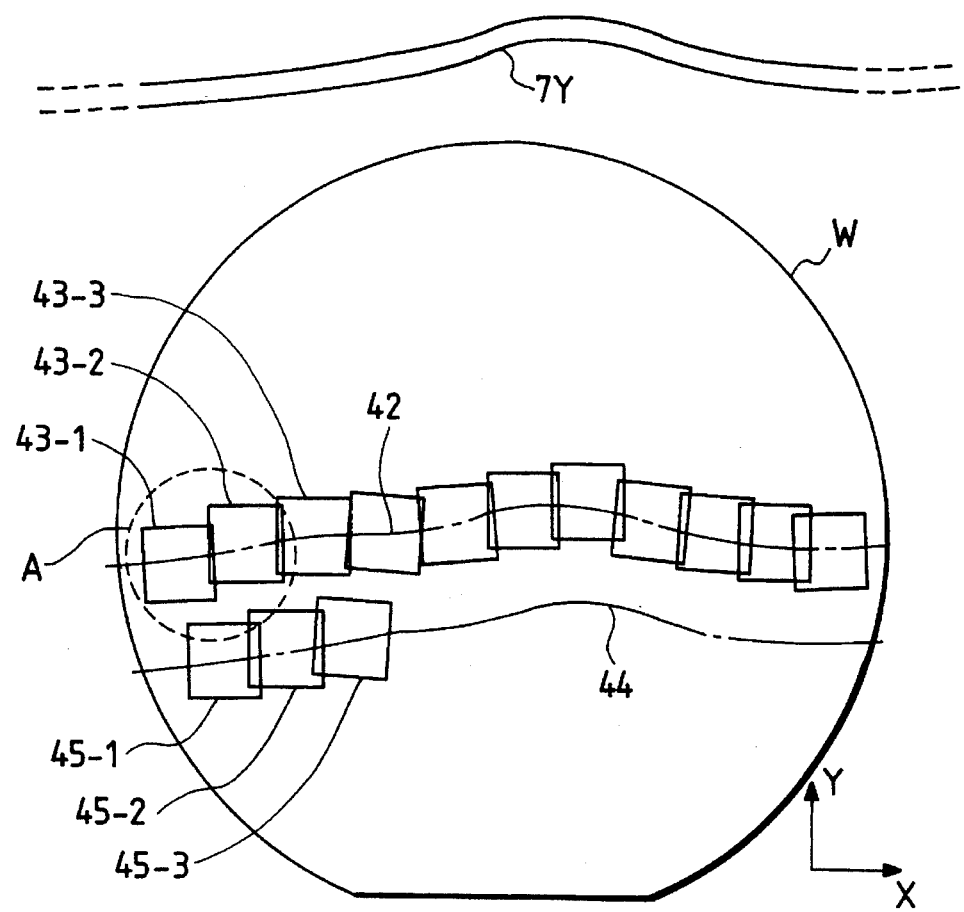
FIG. 8A is a plan view showing a bent state of an array of shot areas on a wafer W due to the bent shape of a movable mirror 7Y.

In step 200 in FIG. 6, the test reticle R1 is set as the reticle R in FIG. 7, and a non-exposed wafer W coated with a photosensitive material such as a resist is set on the wafer holder 29. In step 201, the main control system 30 measures the temperature of the movable mirror 7Y for the Y-axis via the temperature sensor 31Y since the degree of the bent state of the movable mirror 7Y changes depending on the temperature. Thereafter, in step 202, the pattern on the entire surface of the test reticle R1 is sequentially exposed on the first array of shot areas, in the X-direction perpendicular to the plane of drawing of FIG. 7, on the wafer W, while stepping the wafer stage 6 in FIG. 7. Thus, as shown in FIG. 8A, the pattern image of the test reticle R1 is transferred onto each of shot areas 43-1, 43-2, 43-3, . . . in a first array 42 along the X-direction on the wafer W. In this case, the measurement mark images at the end portions in the X-directions are exposed on adjacent shot areas to overlap each other.

In step 203, the pattern on the entire surface of the test reticle R1 is sequentially exposed on the second array of shot areas, in the X-direction, on the wafer W, while stepping the wafer stage 6. The second and first arrays of shot areas are shifted by a ½ pitch in the X-direction. Thus, as shown in FIG. 8A, the pattern image of the test reticle R1 is transferred onto each of shot areas 45-1, 45-2, 45-3, . . . in a second array 44 parallel to the first array 42 on the wafer W. In this case as well, the measurement mark images at the end portions in the X-directions are exposed on adjacent shot areas to overlap each other.

In step 204, the wafer W is subjected to, e.g., development to convert latent images exposed in steps 202 and 203 into recess or projecting patterns. Thereafter, the wafer W is set on the wafer holder 29 (FIG. 7) again, and the positions of the measurement mark images on the wafer W are measured using the alignment system 37. More specifically, in step 205, the positions of the measurement mark images on the shot areas in the first array 42 in FIG. 8A are measured, and the relative array, in the Y-direction, of shot areas in the first array 42 is calculated while correcting the rotation amount of each shot area on the basis of the measured result. The calculated relative array serves as an absolute array with reference to, e.g., the shot area 43-1 at the left end.

Figure 8B:
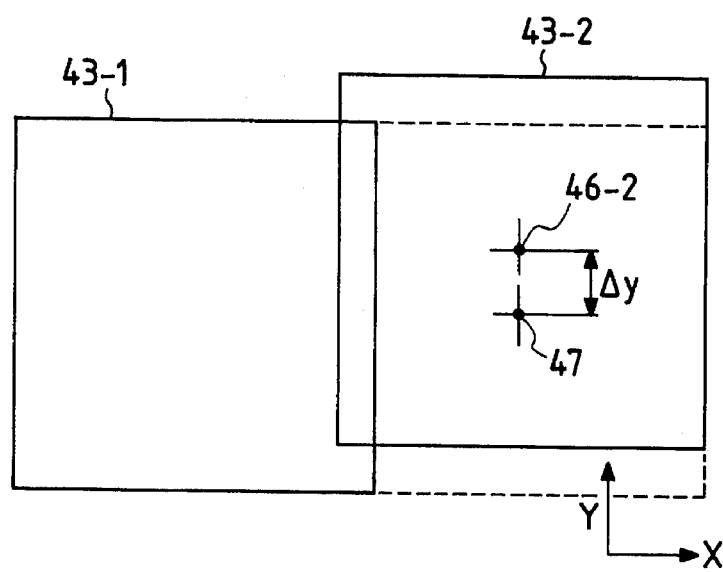
FIG. 8B is an enlarged plan view of a portion A in FIG. 8A.

In this case, assuming that adjacent shot areas do not suffer from any rotation error, the position of a center 46-2 of the shot area 43-2 is shifted by Δy in the Y-direction from the position of a center 47 obtained when the movable mirror 7Y is not bent, as shown in FIG. 8B. The bent amount of the movable mirror 7Y is calculated from this shift amount Δy. However, since the shift amount includes a rotation error in practice, a method of calculating the shift amount in the Y-direction based on the rotation error will be described below with reference to FIG. 9.

Figure 9:
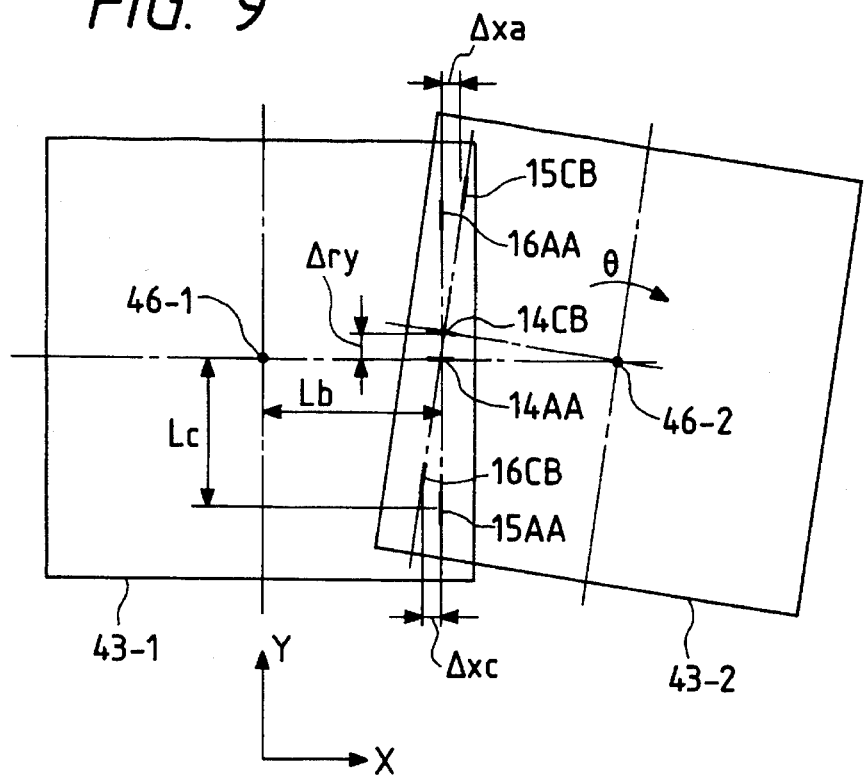
FIG. 9 is an explanatory view of a rotation error between adjacent shot areas.

FIG. 9 shows a state wherein the second shot area 43-2 is rotated about the center 46-2 in a θ direction with respect to the first shot area 43-1. Referring to FIG. 9, images 14AA to 16AA of the measurement marks 14A to 16A in FIG. 2A are formed on the first shot area 43-1, and images 14CB to 16CB of the measurement marks 14C to 16C in FIG. 2A are formed on the second shot area 43-2.

In this case, due to the rotation in the θ direction, the measurement mark images 15AA and 16CB are shifted from each other by Δxc in the X-direction, and the measurement mark images 16AA and 15CB are shifted from each other by Δxa in the X-direction. Note that Δxa and Δxc have opposite signs. Also, the measurement mark images 14AA and 14CB are shifted from each other by Δry in the Y-direction. This Δry will be referred to as a rotation error hereinafter.

Then, if the known interval from a center 46-1 of the shot area 43-1 to the center of the measurement mark image 14AA is represented by Lb, and the known interval from the measurement mark image 14AA to the center of the measurement mark image 15AA is represented by Lc, the following equation is established:

$$\Delta ry = \{(\Delta xa - \Delta xc)/2\}(Lb/Lc) \quad (5)$$

Referring to FIG. 9, even when the position of the shot area 43-2 is further shifted in the Y-direction, the shift amounts Δxa and Δxc in the X-direction are left unchanged. On the other hand, when the position of the shot area 43-2 is shifted in the X-direction, the same offset is added to the shift amounts Δxa and Δxc in the X-direction, but their difference (Δxa−Δxc) remains the same. More specifically, the rotation error Δry can always be precisely calculated based on equation (5) using the two shift amounts Δxa and Δxc in the X-direction of the measurement mark images. Therefore, if the actually measured shift amount in the Y-direction between the measurement mark images 14AA and 14CB in FIG. 9 is represented by Δyb, a value obtained by subtracting the rotation error Δry from this shift amount Δyb is the position shift amount, in the Y-direction, of the shot area 43-2.

Figure 10A:
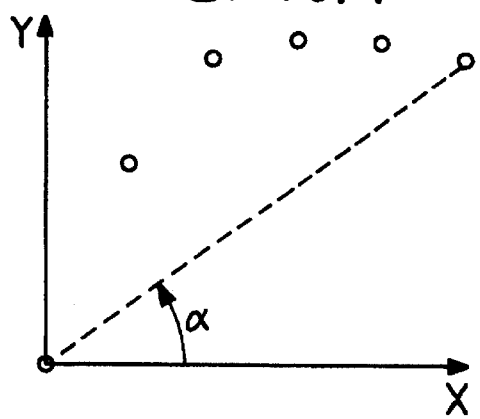
FIGS. 10A to 10E are graphs for explaining a sequence for calculating the bent shape of the movable mirror on the basis of measured data.
Figure 10B:
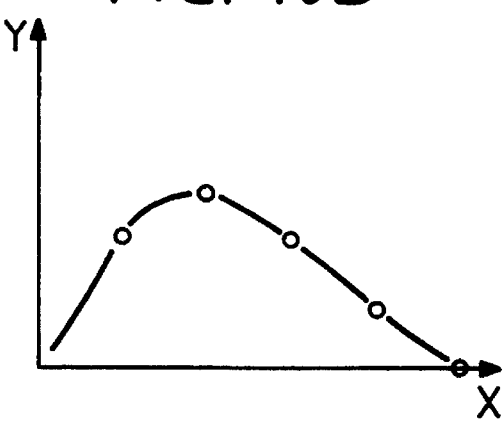

The position shift amounts Δy, in the Y-direction, between each two adjacent shot areas in the first array 42 in FIG. 8A are sequentially calculated by the above-mentioned method. When the values of the position shift amounts Δy in the Y-direction are added and plotted in correspondence with the X-coordinates with reference to a certain reference position, e.g., the position of the shot area 43-1 at the left end, a data sequence having an inclination α can be obtained, as shown in FIG. 10A. This inclination α is an offset for all adjacent shot areas, and is generated due to a shift of the degree of orthogonality between the movable mirror 7X for the X-axis and the movable mirror 7Y for the Y-axis, rotation of the test reticle R1, and the like. When this inclination α is removed by a calculation, the bent shape of the movable mirror 7Y for the Y-axis can be obtained, as shown in FIG. 10B. The inclination α can be determined by, e.g., a least square method. Since the distance between measurement points is limited by, e.g., the size of each shot area upon exposure, the shape of the movable mirror 7Y between the measurement points can be expected as a solid curve in FIG. 10B using some interpolation (e.g., an interpolation based on a spline function).

Figure 10C:
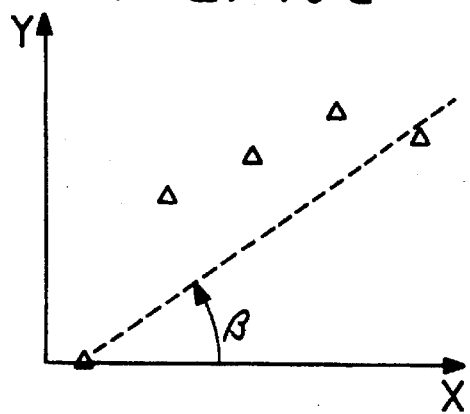

However, a value between the measurement points obtained by executing the interpolation has low reliability. Thus, in order to obtain the bent shape of the movable mirror 7Y with higher precision, in step 206 in FIG. 6, the relative array (position shift amount) in the Y-direction is calculated while performing rotation amount correction of the shot areas in the second array 44 in FIG. 8A. Since the second array 44 is shifted by a ½ pitch from the first array 42, when the position shift amounts, in the Y-direction, associated with the shot areas in the second array 44 are added and plotted, a data sequence of intermediate measurement points of the measurement point shown in FIG. 10A is obtained, as shown in FIG. 10C. When an inclination D is removed from this data sequence as well, the bent shape of the movable mirror 7Y is obtained, as shown in FIG. 10D.

Figure 10D:
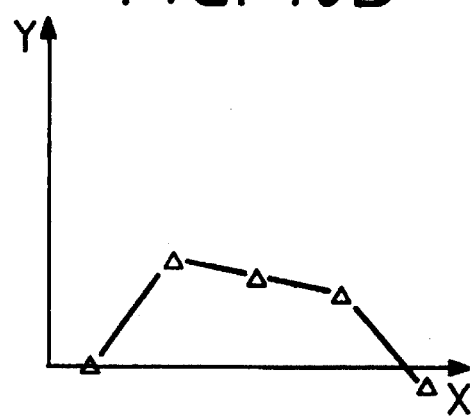
Figure 10E:
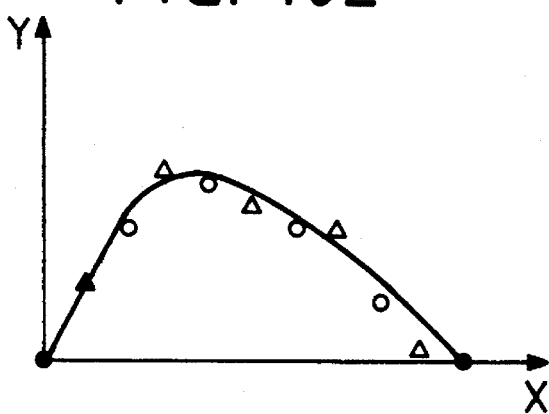

Since the data sequences shown in FIGS. 10B and 10D have different offsets, they cannot be combined as measured results for an identical shape in this state. Thus, in step 207 in FIG. 6, an offset amount for the data sequence shown in FIG. 10D is calculated by the least square method, so that the square sum of a difference between the position shift amount in the Y-direction at the intermediate point in the X-direction on the interpolated curve of the data sequence shown in FIG. 10B associated with the first array, and the position shift amount in the Y-direction at the measurement point of the data sequence shown in FIG. 10D associated with the second array is minimized. Then, when the data sequence shown in FIG. 10B and the data sequence shown in FIG. 10D added with the calculated offset amount are combined, a data sequence shown in FIG. 10E is obtained. The data sequence shown in FIG. 10E obtained by combining the two data sequences is assumed as a single data sequence, and an approximate curve is calculated using, e.g., least square approximation (e.g., smoothing spline approximation), thereby achieving measurement of the bent shape of the movable mirror 7Y with higher resolution.

In this case, in order to measure the bent shape of the movable mirror 7Y with higher precision and higher resolution, it is preferable that the interval in the X-direction between two adjacent measurement points of the data sequence is decreased as much as possible, and data of a data sequence whose position is shifted in the X-direction are combined. Then, in step 208 in FIG. 6, the main control system 30 stores a function S(X) represented by a solid curve in FIG. 10E as the bent shape information of the movable mirror 7Y for the Y-axis in the memory 36 as a correction coefficient. The position shift amount Δy in the Y-direction at each X-coordinate obtained when the wafer stage 6 is moved in the X-direction by the step-and-repeat method using the movable mirror 7Y for the Y-axis in practice is given by:

$$\Delta y = S(x) \quad (6)$$

Therefore, upon movement of the wafer stage 6 in the X-direction, when the position shift amount Δy is subtracted from the coordinate value measured by the laser interferometer 8Y for the Y-axis, and the wafer stage 6 is moved based on the calculated coordinate value, the wafer stage 6 can move as if the movable mirror 7Y for the Y-axis were straight.

In step 210 in FIG. 6, the main control system 30 measures the temperature of the movable mirror 7X (see FIG. 12) for the X-axis, and in step 211, the bent shape of the movable mirror 7X for the X-axis is measured in the same manner as in the movable mirror 7Y for the Y-axis. In step 212, the main control system 30 stores a function represented by a solid curve in FIG. 10E as the bent shape of the movable mirror 7X for the X-axis in the memory 36 as a correction coefficient. Thereafter, in step 213, an actual exposure reticle is set as the reticle R in FIG. 7, and an exposure wafer W is set on the wafer holder 29. In this state, exposure is performed on each shot area on the wafer W, while correcting the bent shapes of the movable mirrors 7X and 7Y for the X- and Y-axes. In this case, since the wafer stage 6 is moved as if the movable mirrors 7X and 7Y had almost completely flat reflection surfaces, arrays of shot areas can be exposed straight in the X- and Y-directions, and matching precision between different exposure apparatuses can be improved.

When the measurement marks 15A, 16A, 16C, and 15C in FIGS. 2A and 2B adopt cross-shaped marks, the bent shape of the movable mirror 7Y can be measured without using the measurement marks 14A and 14C respectively formed between the measurement marks 15A and 16A and between the measurement marks 16C and 15C.

Figure 11:
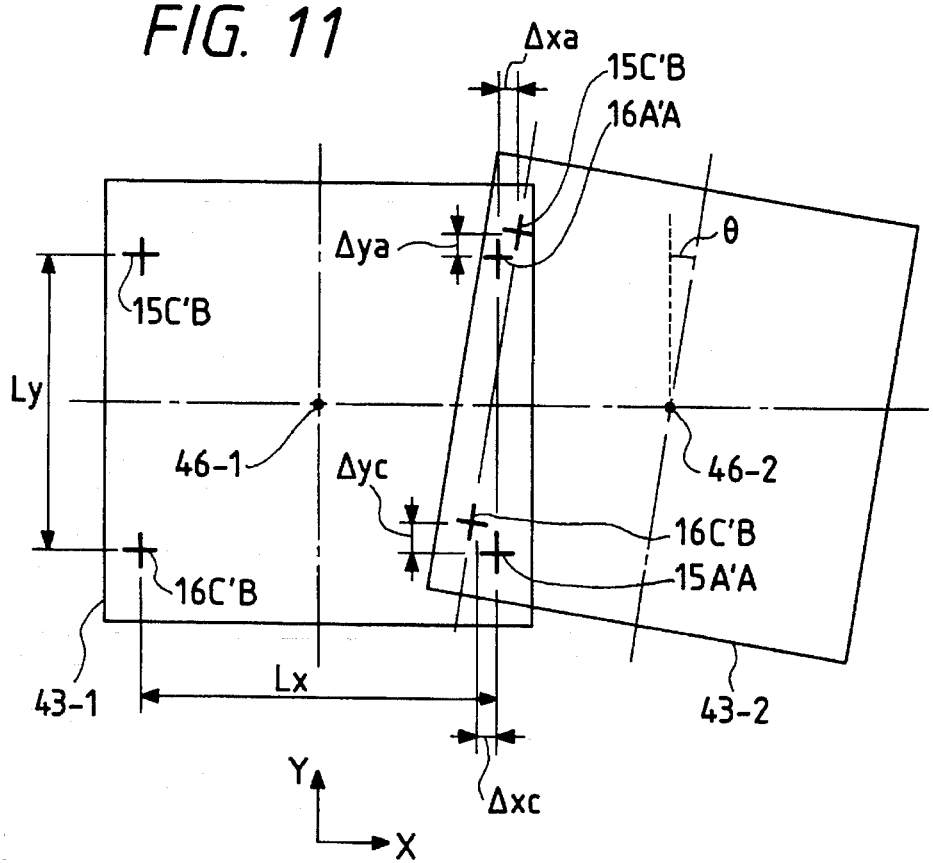
FIG. 11 is an explanatory view of a rotation error between adjacent shot areas when a modification of a measurement pattern shown in FIGS. 2A to 2C is used.

FIG. 11 shows a state wherein the second shot area 43-2 is rotated about the center 46-2 in the θ direction with respect to the first shot area 43-1. Referring to FIG. 11, images 15A'A and 16A'A of cross-shaped measurement marks 15A' and 16A' are formed on the first shot area 43-1, and images 15C'B and 16C'B of cross-shaped measurement marks 15C' and 16C' are formed on the first shot area 43-2. In this case, due to rotation in the θ direction, the measurement mark images 15A'A and 16C'B are shifted by $\Delta xc$ in the X-direction, and by $\Delta yc$ in the Y-direction, and the measurement mark images 16A'A and 15C'B are shifted by $\Delta xa$ in the X-direction and by $\Delta ya$ in the Y-direction, respectively.

In this case, a rotational angle θ is expressed as follows:

$$(\Delta ya - \Delta yc)/(2Lx) \approx \theta \quad (7)$$

The rotation error $\Delta ry$ is expressed as follows. In this case, since Lx=Ly, as described above, Lx and Ly will simply be expressed by L (=Lx=Ly) hereinafter.

$$\Delta ry = \{(\Delta xa - \Delta xc)/2\}\{(\Delta ya - \Delta yc)/(2L)\} = (\Delta xa - \Delta xc)(\Delta ya - \Delta yc)/(4L) \quad (8)$$

The shift amount $\Delta yb$ in the Y-direction is given by:

$$\Delta yb = (\Delta ya + \Delta yc)/2 \quad (9)$$

Therefore, the position shift amount $\Delta y$, in the Y-direction, of the shot area 43-2 obtained by subtracting the rotation error $\Delta ry$ from this shift amount is given by:

$$\Delta y = \Delta yb - \Delta ry = (\Delta ya + \Delta yc)/2 - (\Delta xa - \Delta xc)(\Delta ya - \Delta yc)/(4L) \quad (10)$$

Similarly, the bent shape of the movable mirror 7X for the X-axis is measured using cross-shaped marks as the measurement marks 15D, 16D, 15B, and 16B shown in FIGS. 2A and 2B. When the cross-shaped marks are used in the measurement marks, two each measurement marks need only be formed, and the measurement marks 14A, 14B, 14C, and 14D in FIGS. 2A and 2B can be omitted.

When the bent shapes of the movable mirrors 7X and 7Y may change due to a change in temperature caused by, e.g., heat generated upon movement of the wafer stage 6, absorption of exposure energy, and the like, the bent shapes of the movable mirrors 7X and 7Y are calculated in advance at a plurality of different temperatures. In actual exposure, the temperatures of the movable mirrors 7X and 7Y are measured as needed, and the coordinates measured by the laser interferometers are corrected using data of the bent shapes corresponding to the measured temperature, and arrays of shot areas can be exposed straight in the X- and Y-directions.

When the bent shapes of the movable mirrors 7X and 7Y are actually measured, a plurality of arrays may be exposed on a single wafer in the X-direction so as to eliminate a measurement error by averaging, and data at measurement points having the same X-coordinates may be averaged. Thus, the bent shapes of the movable mirrors 7X and 7Y can be measured more precisely.

In the above embodiment, the rotation errors in units of shot areas are calculated by utilizing the position shift amounts of the measurement mark images. However, when a mechanism capable of measuring the rotation amounts in units of steps of the wafer stage 6 is equipped, the rotation amounts may be measured using this mechanism.

Also, the distortion of the projection optical system according to the first embodiment may be calculated using the apparatus shown in FIG. 7 and the test reticle R2 of the first embodiment. At this time, distortions may be obtained from a plurality of shot areas, and the main control system 30 may be calculate a distortion by averaging the obtained distortions.

The positions of the measurement mark images on an overlapping portions between adjacent shot areas in FIG. 9 are normally measured after development of the wafer W. However, upon execution of exposure onto the wafer W, the refractive index of the resist becomes different between an exposed portion and a non-exposed portion. Therefore, the positions of the measurement mark images can be measured based on the change in refractive index while latent images are still undeveloped. Thus, the bent shapes of the movable mirrors 7X and 7Y can be efficiently measured without executing development.

In the measurement of the distortion according to the first embodiment as well, the positions of the latent images of the measurement marks may be measured.

In this manner, the present invention is not limited to the above-mentioned embodiments, and various changes and modifications may be made within the spirit and scope of the invention.

What is claimed is:

1. A method of measuring a bent shape of a movable mirror of an exposure apparatus, which comprises:

a two-dimensionally movable stage;

a mirror provided to said stage;

a measurement system for radiating a light beam onto said mirror, and measuring a position of said stage using the light beam reflected by said mirror;

an illumination optical system for illuminating a mask; and a projection optical system for forming an image of said mask on a substrate placed on said stage, said method comprising:

the first step of stepping said stage along array coordinates on the basis of a measured value of said measurement system;

the second step of sequentially exposing first and second measurement marks on said substrate, so that an image of said first measurement mark and images of said second measurement mark are formed at respective positions on said substrate, said mask having the first and second measurement marks;

the third step of measuring differences between the positions of the images of the first and second measurement marks; and the fourth step of calculating a bent shape of said mirror on the basis of the differences between the positions of the images of the first and second measurement marks.

2. A method according to claim 1, wherein the fourth step includes:

the step of calculating a rotation amount of the image on said mask transferred onto said substrate on the basis of the differences between the positions of the images of the first and second measurement marks; and the step of calculating a relative array of a plurality of shot areas on said substrate on the basis of the differences between the positions of the images of the first and second measurement marks, and the rotation amount, and the bent shape of the mirror is calculated on the basis of the calculated relative array of the plurality of shot areas.

3. A method according to claim 2, wherein the step of calculating the rotation amount of the image on said mask includes:

the step of calculating the rotation amount of the image on said mask on the basis of differences between positions of images associated with the stepping direction of the differences between the positions of the images of the first and second measurement marks, and the step of calculating the relative array of the plurality of shot areas includes:

the step of calculating the relative array of the plurality of shot areas by removing the rotation amount from a difference between positions of images associated with a direction substantially perpendicular to the stepping direction of the differences between the positions of the images of the first and second measurement marks measured in the third step.

4. A method according to claim 3, wherein the fourth step includes the step of calculating the bent shape of said mirror extending in the stepping direction.

5. A method according to claim 3, wherein the first measurement mark has at least two marks of two X measurement marks for measuring the difference between positions associated with the stepping direction, and a Y measurement mark for measuring the difference between positions associated with the direction substantially perpendicular to the stepping direction, and the second measurement mark has a portion having substantially the same shape as the first measurement mark.

6. A method according to claim 2, wherein the fourth step includes the step of calculating the relative array between two adjacent shot areas on the basis of the difference between the positions of the images of the first and second measurement mark images between the two adjacent shot areas.

7. A method according to claim 1, wherein the first and second measurement marks are provided to said mask to be separated by a predetermined distance in a direction conjugate with the stepping direction.

8. A method according to claim 1, wherein the third step includes the step of measuring the differences between the positions of latent images of the first and second measurement marks.

9. An exposure method for an exposure apparatus, which comprises:

a two-dimensionally movable stage;

a mirror provided to said stage;

position measurement means for radiating a light beam onto said mirror, and measuring a position of said stage using the light beam reflected by said mirror;

an illumination optical system for illuminating a mask; and a projection optical system for forming an image of said mask on a substrate placed on said stage, said method comprising:

the first step of stepping said stage along array coordinates on the basis of a measured value of said position measurement means;

the second step of sequentially exposing first and second measurement marks on a plurality of shot areas on said substrate, so that an image of said first measurement mark and images of said second measurement mark are formed at respective positions on said substrate, said mask having the first and second measurement marks;

the third step of measuring differences between the positions of the images of the first and second measurement marks;

the fourth step of calculating a relative array of the plurality of shot areas on said substrate on the basis of the differences between the positions of the images of the first and second measurement marks measured in the third step;

the fifth step of calculating a bent shape of said mirror on the basis of the relative array of the plurality of shot areas on said substrate calculated in the fourth step;

the sixth step of correcting a measured value of said position measurement means on the basis of the bent shape of said mirror; and the seventh step of forming an image of a transfer pattern on said substrate by stepping said stage on the basis of the measured value of said position measurement means, which value is corrected in the sixth step, said mask having the transfer pattern.

10. A method according to claim 9, wherein said mask includes a measurement mask and an exposure mask, said measurement mask has the first and second measurement marks, and said exposure mask has the transfer pattern, said substrate includes a measurement substrate and an exposure substrate, the second step includes the step of exposing the first and second measurement marks on said measurement substrate, and the seventh step includes the step of forming the image of the transfer pattern on said exposure substrate using said exposure mask.

11. A method according to claim 9, wherein the fifth step includes the step of calculating the bent shape of said mirror by least square approximation.

12. A method according to claim 9, wherein the fourth step includes the step of calculating the relative array of the plurality of shot areas on the basis of at least two pieces of information associated with the relative array of the plurality of shot areas.

13. A method according to claim 12, wherein the fourth step includes the step of calculating the relative array of the plurality of shot areas by combining the at least two pieces of information associated with the relative array using a least square method, so that a difference between the at least two pieces of information associated with the relative array of the plurality of shot areas is minimized.

14. A method according to claim 9, wherein said exposure apparatus comprises temperature measurement means for measuring a temperature of said mirror, and the sixth step includes the step of correcting the measured value of said position measurement means on the basis of bent shape information of said mirror corresponding to the measured temperature.

15. A method according to claim 1 or claim 9, wherein said second step is performed so that images of at least two first measurement marks and images of at least two second measurement marks are formed at respective positions on said substrate.

16. A method according to claim 1 or claim 9, wherein said second step is performed so that images of said first mark and said second mark substantially overlap each other.

17. A method of measuring a bent shape of a mirror of an exposure apparatus, which comprises:

- a stage for holding a substrate and being movable along orthogonal first and second directions;
- a first mirror provided to said stage and having a plane reflector extending in said second direction;
- a second mirror provided to said stage and having a plane reflector extending in said first direction;
- a device for radiating light beams onto said first and second mirrors, and measuring the positions of said stage with respect to said first and second directions using light beams reflected by each of said mirrors; and
- an illumination optical system for illuminating a mask on which first and second marks are provided at different positions with respect to said first direction so as to form images of said first and second marks on said substrate, said method comprising:

the first step of stepping said stage along at least the first direction according to array coordinates on the basis of a measured value of said device and sequentially exposing said first and second marks such that said images of said first mark and said second mark are formed at respective positions on said substrate with respect to the first direction and the second direction;

the second step of measuring differences between the positions of the images of the first and second marks; and the third step of calculating a bent shape of at least said second mirror on the basis of the differences between the positions of the images of said first and second marks.

18. A method according to claim 17, wherein said first mark includes at least two marks at different positions with respect to said second direction;

said second mark includes at least two marks at different positions with respect to said second direction; and the first step is performed such that images of at least two first marks and images of at least two second marks are formed at respective positions on said substrate with respect to the first direction and the second direction.

19. A method according to claim 18, further comprising:

the fourth step of stepping said stage along the second direction and sequentially exposing said first and second marks such that images of one of the two first marks and one of the two second marks and images of the remaining first mark and second mark are formed at respective positions on said substrate with respect to the first direction and the second direction; and the fifth step of calculating a bent shape of the first mirror on the basis of differences between the positions of the images of one of the two first marks and one of the two second marks and the images of the remaining first mark and second mark.

20. A method according to claim 17, wherein said first step is performed such that images of said first mark and said second mark substantially overlap each other.

* * * * *